United States Patent [19]
Li et al.

[11] Patent Number: 5,835,677
[45] Date of Patent: *Nov. 10, 1998

[54] LIQUID VAPORIZER SYSTEM AND METHOD

[75] Inventors: Ting Kai Li, Somerville; Alexander I. Gurary, Bridgewater, both of N.J.; Dane C. Scott, Doylestown, Pa.

[73] Assignee: Emcore Corporation, Somerset, N.J.

[*] Notice: This patent issued on a continued prosecution application filed under 37 CFR 1.53(d), and is subject to the twenty year patent term provisions of 35 U.S.C. 154(a)(2).

[21] Appl. No.: 724,766

[22] Filed: Oct. 3, 1996

[51] Int. Cl.⁶ .................................................. C23C 14/26
[52] U.S. Cl. .......................... 392/401; 392/394; 392/399; 392/400; 118/726
[58] Field of Search .................................... 118/725, 726; 261/156; 392/394, 395, 399, 400, 401

[56] References Cited

U.S. PATENT DOCUMENTS

| | | | |
|---|---|---|---|
| 1,207,664 | 12/1916 | Thurston | 261/156 |
| 1,965,144 | 7/1934 | Kane | 261/156 |
| 2,490,547 | 12/1949 | Schraner | 219/39 |
| 2,728,321 | 12/1955 | Davis | 118/725 |
| 2,925,329 | 2/1960 | Yost | 23/281 |
| 2,949,900 | 8/1960 | Bodine . | |
| 3,081,946 | 3/1963 | Soloff . | |
| 3,224,677 | 12/1965 | Schmidt et al. . | |
| 4,349,723 | 9/1982 | Swiatosz | 219/271 |
| 4,541,564 | 9/1985 | Berger et al. . | |
| 4,655,393 | 4/1987 | Berger . | |
| 4,986,216 | 1/1991 | Ohmori et al. . | |
| 4,997,677 | 3/1991 | Wang et al. . | |
| 5,002,928 | 3/1991 | Fukui et al. . | |
| 5,136,975 | 8/1992 | Bartholomew et al. . | |
| 5,204,314 | 4/1993 | Kirlin | 118/726 |
| 5,224,202 | 6/1993 | Arnold et al. . | |
| 5,268,034 | 12/1993 | Vukelic . | |
| 5,361,800 | 11/1994 | Ewing | 137/495 |
| 5,362,328 | 11/1994 | Gardiner | 118/726 |
| 5,372,754 | 12/1994 | Ono | 261/142 |
| 5,383,970 | 1/1995 | Asaba | 118/726 |
| 5,421,895 | 6/1995 | Tsubouchi | 118/726 |
| 5,425,810 | 6/1995 | Coati et al. . | |
| 5,447,568 | 9/1995 | Hayakawa et al. . | |
| 5,451,260 | 9/1995 | Versteeg et al. . | |
| 5,505,782 | 4/1996 | Stauffer . | |

OTHER PUBLICATIONS

Byrne, IBM Tech. Dis. Bul. vol. 16 No. 5, Oct. 1973, pp. 1621–1622.

*Primary Examiner*—Richard Bueker
*Attorney, Agent, or Firm*—Lerner, David, Littenberg, Krumholz & Mentlik

[57] ABSTRACT

A liquid vaporizer apparatus and method for chemical vapor deposition of liquid solutions into a controlled atmosphere of a CVD reaction chamber. The apparatus comprises an atomizer, gas curtain, heated porous media disks and a carrier gas mixer. The invention provides for the independent control of temperature, pressure and precursor stoichiometry during the atomizing and vaporization process thereby rendering the precise precursor vapor quality and quantity required for a given application. The invention employs the use of removable porous media disks which may be varied according to the desired operating pressure and precursors. In operation, the apparatus provides for a liquid precursor to first be atomized into a mist using an ultrasonic nozzle, then vaporized by heated media disks, and mixed with a carrier gas, then forced into CVD reaction chamber.

53 Claims, 2 Drawing Sheets

LIQUID VAPORIZER SYSTEM AND METHOD

FIELD OF THE INVENTION

The present invention relates to a chemical vapor deposition apparatus, and, more particularly, to a precursor liquid vaporization device having improved controllability of stoichiometry and rate of deposition of vaporized liquid precursor. The present invention further relates to a method of vaporizing liquid precursors.

BACKGROUND OF THE INVENTION

In the production of electronic microcircuits, many processing methods require that a reactive chemical or precursor be deposited onto a substrate wafer in an atmospherically-controlled heated reactor. These precursors typically must be converted from their solid or liquid state into their gaseous or vapor state because of the finer degree of uniformity achieved by vapor deposition. The precursor vapor, once generated, is directed into a reaction chamber where it passes over the substrate and subsequently deposits. This process is typically called chemical vapor deposition or "CVD". The deposited precursor chemical may form fine crystalline or amorphous layers which are required for creating microcircuits on the face of the substrate. In the CVD process, it is very important that the deposited chemical layers are pure and have uniform thicknesses throughout the surface of the substrate wafer in order for the resultant microcircuit to operate properly. The vaporized precursor must be carefully introduced into the reactor. The purity and uniformity of the deposited layers of precursors are determined by controlling and maintaining certain physical parameters such as temperature, stoichiometry, flow rate, and pressure during the formation of the precursor vapor. Many earlier attempts at conducting these processes have focused on vaporization of the precursor and introduction of some controllability of the above mentioned parameters, but have not satisfactorily overcome the problems associated therewith for some precursors.

For example, in some CVD processing systems the precursors are delivered to the reactor by bubbling a carrier gas through a supply of liquid precursor solution, which is usually heated. This device is known as a bubbler. These systems vaporize the precursor by employing a stream of carrier gas bubbled through a solution of precursor, which is usually temperature controlled, whereby the gas stream acts as a vehicle that actually carries precursor molecules into the vapor phase. The result is a vapor mixture of carrier gas and precursor.

Once generated, the vapor mixture is fed into the reactor. The flow of the carrier gas determines the quantity and concentration of precursor that is fed into the reactor. The problem with bubbler systems is that some precursors cannot be vaporized by simply blowing gas through a precursor solution. This is due to several physical properties of the precursor such as a very low vapor pressure, a high sublimation temperature or poor thermal stability at or near the sublimation point. Some systems employing bubblers have employed heated delivery lines and other devices to prevent the condensation of precursors that are reluctant to form vapors.

These heated devices can represent a source of impurities, and frequently cause thermal degradation of the precursor, which is normally intolerable for the production of CVD products. At the very least, the bubbler devices fall short of offering a sufficient degree of controllability for many precursor applications, and their use may result in irregular layer formation, impurity contamination, and inconsistent concentration of the delivered precursor vapor. In addition, bubblers cannot deliver high concentrations of precursors to processes that require high growth rates, because the carrier gas becomes saturated.

In an effort to overcome these problems, several attempts have been made to deliver precursors to CVD reactors by dissolving the precursors into an appropriate liquid solvent. The resulting solution is then delivered to a device that introduces the precursor to the reactor as either a liquid or as a vapor. These systems will normally vaporize the liquid precursor by either spraying the liquid through an orifice or forcing the material through a porous material that is heated. The resulting vaporized precursor is then forced out of the vaporizing device using a carrier gas. Some of these devices simply allow the liquid to be sprayed directly into the reaction chamber whereby the precursor droplets are converted into vapor by virtue of the reduced pressure and the elevated temperatures inside the chamber. Some of these devices also employ the use of an ultrasonic nozzle sprayer which disperse the liquid precursor into very fine liquid droplets.

As in the bubbler type systems, it is important to control various parameters such as temperature, pressure, stoichiometry, and flow rate. In addition, the liquid sprayer systems require further monitoring of the droplet size of the atomized liquid, the surface area of the porous heating surfaces, the liquid head pressure delivered up to the spray nozzle or orifice, and the exit pressure interfaced with the reaction chamber.

In current liquid vaporizer designs, many of the above-mentioned characteristics are interdependent and lack the overall control necessary to produce the desired vapor quality for some CVD applications. For example, a change in carrier gas velocity may cause a more rapid convective evaporation of the solvents in the liquid, thus lowering the vapor pressure of the other material present. This fluctuation in volatility, in turn, effects the stoichiometry of the precursor being introduced into the reaction chamber, and thus changes the concentration of precursor and carrier gas introduced into the reaction chamber.

Another problem with liquid vaporizers is that the atomized liquid droplets contact the walls of the vaporizing device where they will either condense into larger drops of liquid (if the walls are cool) or will thermally decompose (if the walls are excessively heated). This occurs because these systems lack the ability to control the direction of the atomized droplets once formed. These devices also are unable to separately control different segments of the vaporizer chamber so that condensation and thermolysis are avoided.

The present invention solves or substantially mitigates many of the problems described above when vaporizing liquid precursors, such as those used in a CVD processing system. The present invention provides for the evaporation of materials with a high solids content or low vapor pressure without the vapor precursor prematurely condensing before introduction into the reaction chamber as well as controlling stoichiometry by independently adjusting temperature, pressure and gas flow rate of the vaporization system, thus rendering the desired quality of vapor necessary for proper deposition required by the application. Therefore, the practice of the present invention overcomes the problems generally encountered in CVD processing because each variable present in the vaporization of liquid precursors is independently controllable.

It is therefore an object of the present invention to minimize the interdependency of the many control factors by the isolation of atomization, heating, evaporation and gas flow amalgamation.

It is another object of this invention to provide for the evaporation of precursor materials with a high solids content or low vapor pressure and minimize the accumulation precursor build up within the atomizer.

It is yet another object of this invention to provide a method of delivering liquids to an evaporation media with a defined and consistent droplet size distribution independent of gas pressures and liquid pressures within the vaporization chamber.

It is still another object of this invention to provide a system which maintains the liquid components at a selectable temperature.

It is still another object of this invention to provide a system which minimizes in-line cleaning volume.

It is still a further object of this invention to provide a system that allows for the controlled heating of the evaporation media keeping the media temperature independent of the temperature of the liquid during atomization.

It is another object of the invention to provide a system which maintains a gas curtain around the atomized material to eliminate condensation and material deposition onto unheated areas.

It is still another object of this invention to provide a system which reduces purge volume of the system.

It is yet a further object of this invention to provide a system which utilizes easily replaceable evaporation media for easy cleaning.

It is still a further object of this invention to provide a system that allows for the blending of controlled quantities of preheated carrier gas with the evaporated precursor material.

It is still another object of this invention to provide a system that allows for the isolation of the blending gas and the atomization from the exit atmosphere.

SUMMARY OF THE INVENTION

These and other objects have now been realized by the discovery of a liquid vaporizer apparatus which comprises a chamber having at least one liquid precursor supply inlet and at least one vapor outlet, atomizing means for converting the at least one liquid precursor into an atomized mist within the chamber, a heated contact surface for vaporizing the atomized mist by direct contact within the chamber, whereby a vapor can be supplied from the at least one vapor outlet.

In accordance with one embodiment of the liquid vaporizer of the present invention, the chamber includes inner walls, and the apparatus includes gas curtain means for introducing a curtain of gas into the chamber for preventing the atomized mist from contacting the inner wall of the chamber.

In accordance with another embodiment of the apparatus of the present invention, the heated contact surface comprises at least one porous contact member, and preferably a plurality of porous contact members. In a preferred embodiment these are porous disks, preferably arranged in series, substantially perpendicularly aligned with respect to the atomizing means.

In accordance with another embodiment of the apparatus of the present invention, the apparatus includes carrier gas means for introducing a carrier gas proximate to the heated porous contact surface so as to mix the vapor with the barrier gas.

In accordance with another embodiment of the apparatus of the present invention, the chamber includes cooling means for cooling the atomizing means. In a preferred embodiment, the chamber includes at least one thermocouple for monitoring the inside temperature of the chamber and for controlling the cooling means thereby.

In accordance with a preferred embodiment of the apparatus of the present invention, the apparatus including carrier gas means also includes heating means for heating the heated contact surface, and preferably in which the chamber includes a jacket surrounding the heating means and associated with the carrier gas means for preheating the carrier gas prior to introduction proximate to the heated contact surface.

In accordance with another embodiment of the apparatus of the present invention, the apparatus further includes an outer evacuated jacket for insulating the chamber from ambient temperatures. In accordance with another embodiment of the apparatus of the present invention, the heated contact surface is removable.

In accordance with a preferred embodiment of the apparatus of the present invention in which a plurality of porous contact surface members are used, they vary in porosity whereby a pressure gradient is formed between the chamber and the at least one vapor outlet.

In accordance with a preferred embodiment of the apparatus of the present invention, the apparatus includes means for connecting the at least one vapor outlet to a chemical vapor deposition reaction chamber.

In accordance with a preferred embodiment of the apparatus of the present invention, a liquid vaporizer apparatus is provided for supplying a vapor to a chemical vapor deposition reaction chamber comprising a chamber having at least one liquid supply liquid for supplying at least one liquid precursor to the chamber and at least one vapor outlet, an ultrasonic nozzle for converting the at least one liquid precursor into atomized mist within the chamber, and a heated contact surface for vaporizing the atomized mist by direct contact within the chamber, whereby a vapor can be supplied to the at least one vapor outlet.

In accordance with the present invention, a method is also provided for vaporizing a liquid precursor comprising the steps of providing a liquid precursor to an atomizer within a chamber, atomizing the liquid precursor into a mist, and vaporizing the liquid precursor mist into a vapor by contacting the liquid precursor mist with a heated contact surface.

In accordance with one embodiment of the method of the present invention, the method includes providing a gas curtain within the chamber surrounding the liquid precursor mist so as to prevent the liquid precursor mist from contacting the walls of the chamber.

In accordance with another embodiment of the method of the present invention, the liquid precursor is intended for use in a chemical vapor deposition reactor, and the method includes supplying the vapor to the chemical vapor deposition reactor.

In accordance with another embodiment of the method of the present invention, the method includes contacting the liquid precursor with a plurality of heated porous contact surfaces in series.

In accordance with another embodiment of the method of the present invention, the method includes introducing a carrier gas at a location proximate the heated contact surface so as to mix the vapor with the carrier gas.

In accordance with another embodiment of the method of the present invention, the method includes providing cooling during the atomizing step.

In accordance with a preferred embodiment of the method of the present invention, the method includes preheating the carrier gas prior to introducing the carrier gas at a location proximate to the heated contact surface.

In accordance with another embodiment of the method of the present invention, the method includes the step of removing the heated contact surface for cleaning.

The above-discussed problems associated with the prior art, as well as other shortcomings not mentioned, are resolved to a large extent through the use of the present invention. The present invention thus provides an apparatus and method for the vaporization of liquid precursor chemical reactants, preferably such as those generated for the purposes of chemical vapor deposition.

Illustratively, the present invention preferably consists of several independent sub-units housed within a common structure. The first sub-unit is a device that provides for the delivered liquid precursor to be atomized into liquid droplets using an ultrasonic nozzle. The atomized precursor is dispersed into an expansion zone immediately following the ultrasonic nozzle. This expansion is temperature and pressure controlled and independent of the other segments of the vaporizing apparatus. The atomized droplets are preferably contained in an area away from the walls of the expansion zone by use of a gas curtain. The curtain is deployed cylindrically around the nozzle and prevents the droplets from contacting the walls of the structure and thus prevents condensation and build-up of precursor. Once the atomized droplets are carried away from the nozzle, they are forced to contact a heated contact surface. The heated surface converts the liquid droplets into vapor upon contact therewith, while that surface is maintained at a controllable elevated temperature. The vapor is then mixed with preheated carrier gas, preferably using flow rings, and the vapor mixture then exits the vaporizer apparatus and enters the CVD reactor chamber.

The present invention thus provides for the independent control of temperature, pressure, flow rate, and stoichiometry of the precursor vapor. The contact surface is preferably replaceable for easy cleaning and maintenance, and preferably has a porosity which may be varied to provide for the desired flow rates and pressure gradient leading out to the reactor interface.

BRIEF DESCRIPTION OF THE DRAWINGS

These and other features of the invention will be better understood through a study of the following detailed description of a specific embodiment of the invention, which will be more readily appreciated with reference to the drawings, in which.

DETAILED DESCRIPTION OF THE PREFERRED EMBODIMENTS

There are a considerable number of liquid precursors which can be utilized in accordance with the apparatus and method of the present invention. Thus, a particular preferred embodiment of the present invention for use in connection with CVD reactors employs appropriate precursors to produce what are generally referred to as BST films for deposition on various substrates. Such BST (barium strontium titanates) films are thus produced from just one class of liquid precursors for use in connection with a liquid vaporizer apparatus or method of the present invention for producing a vapor for subsequent deposition such as on semiconductor wafers or the like. The present invention, however, is not limited to such BST films, but can also find significant utility in deposing a variety of other compounds for semiconductor use and the like, including, for example, the known Group III-V compound semiconductors.

The use of the term "liquid precursor" in accordance with the present invention thus requires a particular precursor determined by the nature of the film, whether it be a BST film or some other film, which is eventually to be produced in the CVD reactor. Furthermore, at ambient conditions, some of these precursors can be in a liquid form or in a powder form, in which case the powdered material would be dissolved in an appropriate solvent. Various solvents can be used even in connection with the normally liquid precursors, in order to dilute the specific precursor to a desired concentration therewith. This can, in fact, be a significant method of controlling deposition of the ultimate film in the CVD reactor.

In any event, in connection with the preferred BST films produced in accordance with the present invention, examples of precursors for the barium component can include various barium oxide compounds, for example, such as $Ba(C_{11}H_{19}O_2)_2$, which is a powder at room temperature; $Ba[(CH_3)_5C_5]_2$, which is also a powder at room temperature; $Ba(C_{10}H_{10}F_7O_2)_2$, which is also a powder at room temperature; while the strontium component can be provided by the following oxides: $Sr(C_{11}H_{19}O_2)_2$, a powder at room temperature; $Sr(C_{10}F_7H_{10}O_2)_2$, also a powder at room temperature; $Sr(C_5F_6HO_2)_2$, also a powder at room temperature; and $Sr(O_2C_{11}H_{26}N_5)_2$, a powder at room temperature. Finally, the titanium component can be provided by various titanium oxides, including $Ti(C_{11}H_{19}O_2)_3$ or compounds of the formula $Ti(OR)_4$ in which R is an alkyl group, such as ethyl, propyl, butyl or octyl, and the like. Each of these compounds is a liquid at room temperature.

In addition, the present invention can also be utilized to produce other known films for semiconductor deposition, including from Group III-V and Group II-IV compound semiconductors. In this regard, conventional precursors can be utilized, such as trimethyl gallium or triethyl gallium, as well as arsines and nitrides to produce gallium arsinide and gallium nitride films, and/or metal alkyls can be utilized with the hydride or nitride of the Group V constituent in which the alkyl is TMG, TEG, or the like, and the hydride can be arsine, phosphene, or stilbene. In addition, the alkyl compound of the Group III metal compound can also include trialkyl aluminum, indium, or the like.

Depending upon the specific film which is to be deposited, the liquid precursor compound, whether the precursor is normally a powder or a liquid, can also be included in a solvent which is specifically selected based upon the particular precursor being utilized. Thus, in connection with BST films as discussed above, a number of possible solvents exist, including, for example, tetrahydrafuran (THF), isopropanol, tetraglyme, xylene, toluene, butyl acetate, and the like. It is possible for one of ordinary skill in this art to select a particular solvent for the particular liquid precursor being utilized in the apparatus or method of the present invention.

The atomizing means used for converting the liquid precursor into an atomized mist is preferably an ultrasonic spray, preferably having a frequency of from 50 to 120 kHz. The basic objective here is to produce a fine mist of the liquid precursor so that highly uniform droplets are provided. This uniformity of both size and concentration is essential in producing the highly improved results achievable with the present invention.

Once the atomized mist of the liquid precursor has been prepared according to the apparatus and method of the present invention, vapor is produced by contact with a heated contact surface. The heated contact surface itself can take a variety of forms, but it must provide sufficient surface area to accommodate the atomized mist, while at the same time permitting the vapor produced therefrom to pass outwardly to the vapor outlet in the vaporizer apparatus hereof, to be used, for example, in a CVD reactor. Therefore, it is preferred to use a porous contact surface or one which has a high surface area and includes openings or passages to permit the vapor produced after such contact to exit therefrom. It is essential that these porous contact surfaces be made of material having a high thermal conductivity, in order to provide for uniform temperature distribution. It is also important that these materials have a high specific heat, in order to provide for high thermal inertia and for low transient temperature variations.

A preferred form of the heated contact surface of the present invention takes the form of one or more shaped media members or disks. Such a unit or disk can thus be produced by a porous or sintered body such as a metal body such as nickel, or a ceramic body, such as silicon carbide (SiC). One preferred embodiment thus employs a high-porosity metal, such as a material sold under the designation CELMET by Sumitomo Electric USA, Inc. This material is a nickel or nickel chromium alloy material which has a high porosity, generally over about 90%, and a high specific surface area, as well as a high permeability without undue clogging. The material itself can be produced in sheets of various forms and sizes, and is relatively light in weight. The specific surface area of this material can vary over wide ranges, generally from about 500 $m^2/m^3$ up to 7500 $m^2/m^3$ and higher. In a preferred embodiment, a number of disks or other shaped members of this type can be aligned perpendicularly to the flow of the atomized mist to further increase the surface area in contact with the atomized particles.

As an alternative, however, it is possible to use other forms of heated contact surfaces, such as, for example, a number of grill-like or mesh surfaces stacked and relatively rotatable with respect to each other to again provide not only high surface area but high permeability for the flowing vapor as it is produced therefrom. In addition, depending upon the particular liquid precursor being utilized, the selection of the material from which the contact surface is produced can be varied to accommodate the particular substance used in the liquid precursor. The material must, however, be chemically inert to the particular liquid precursors used therewith.

Figure 1:
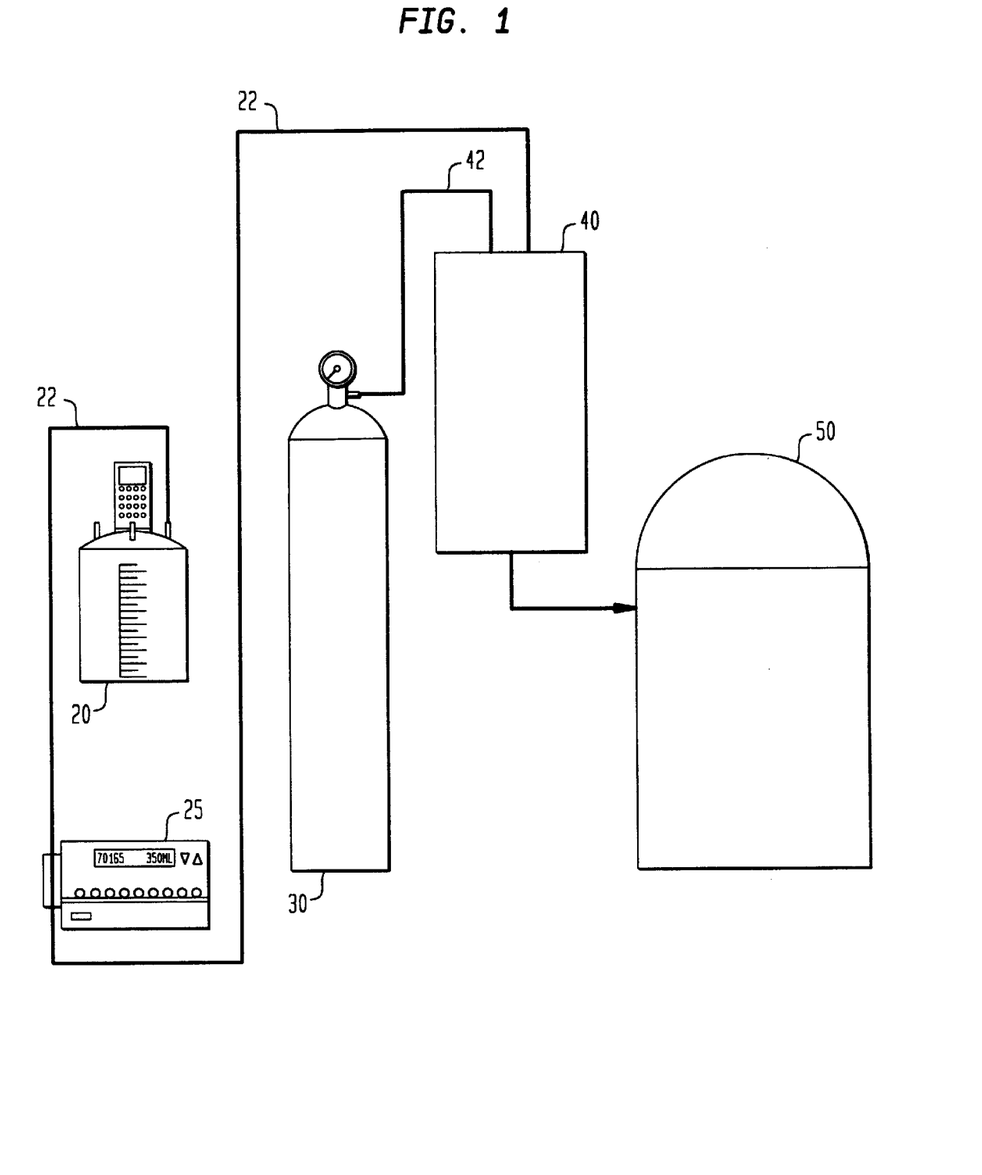
FIG. 1 is a schematic representation of a chemical vapor deposition system constructed for use in conjunction with the present invention.

For a more detailed appreciation of the invention, attention is first invited to FIG. 1 which shows an overall schematic of a chemical vapor deposition system, including the basic external liquid delivery system with which the present invention can be utilized. FIG. 1 thus illustrates a chemical vapor deposition system which includes a liquid precursor tank 20, preferably made of stainless steel. The liquid precursor is delivered from the precursor tank 20 to the vaporizer 40 by use of a feed pump 25. The feed pump 25 draws the liquid precursor from the precursor tank 20 through a feed tube 22 in a controllable fashion, and delivers the precursor to the vaporizer 40. FIG. 1 also represents a carrier gas supply tank 30 connected to the vaporizer 40 by a feed tube 42. Typical inert carrier gases for use in the present invention include nitrogen, hydrogen, argon and helium. The vaporizer exit is connected to the chemical vapor deposition reaction chamber 50 by a feed tube 44 which carries the vaporized precursor vapor to the reaction chamber 50.

Figure 2:
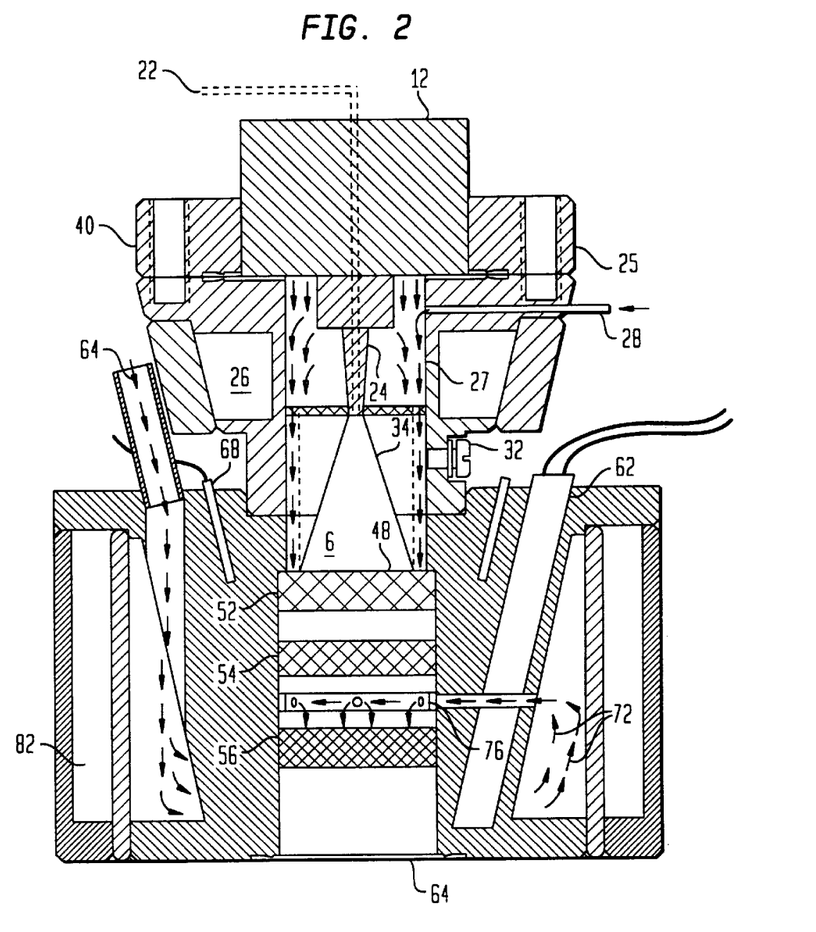
FIG. 2 is a schematic representation of the vaporizer system in one embodiment of the present invention.

FIG. 2 illustrates a schematic representation of the preferred embodiment of the vaporizer apparatus 40. An ultrasonic nozzle 24 is mounted at one end of the vaporizer apparatus 40. The ultrasonic nozzle 24 receives liquid precursor from feed tube 22 mounted in an atomizer housing 12. A cooling jacket 26 surrounds the vaporizer apparatus segment where the ultrasonic nozzle 24 is housed. Thus, a coolant, preferably a cooling liquid, is fed into the cooling jacket 26 for temperature control of the ultrasonic nozzle 24. A curtain gas inlet port 28 is positioned adjacent the cooling jacket 26 and oriented perpendicularly to the ultrasonic nozzle 24 whereby the inlet port 28 inner orifice faces the base of the ultrasonic nozzle 24. This creates a curtain of gas 25, such as nitrogen or argon, descending along the walls of the vaporizer 40 as shown by the arrows in FIG. 2. A thermocouple 32 is mounted immediately adjacent to the cooling jacket 26 and is oriented perpendicularly to the ultrasonic nozzle 24 whereby the thermocouple 32 terminus faces the ultrasonic nozzle 24's effluent end. The thermocouple 32 can thus be used to control the application of coolant into the cooling jacket 26, so as to control the temperature of the atomized mist generated by the ultrasonic nozzle 24. An expansion chamber 34 extends from the ultrasonic nozzle 24 to the front face of the heated contact surface 48, in this case in the form of a series of three porous disks 52, 54 and 56, respectively. The particular heated contact surfaces 48 used in the embodiment of the apparatus of the present invention shown in FIG. 2 comprise porous metallic disks, preferably made of the CELMET material discussed above. In this emobdiment, it is preferred that the disks have a decreasing porosity as one travels away from the injector, or nozzle 24. Thus, in a preferred embodiment porous disk 52 has a porosity of 10 ppm (pore per inch), porous disk 54 has a porosity of 50 ppm, and porous disk 56 has a porosity of 100 ppm.

The porous contact disks 52, 54 and 56 are contained within a vaporizing portion of the vaporizer 40, which includes heating element 62 which extends from one end of the contact surface 48 which faces the ultrasonic nozzle 24, through the opposite end of the porous contact disks 52, 54 and 56, and which terminates at a reaction chamber interface 64. In addition, a thermocouple 68 is shown which is positioned within the housing in close proximity to the heating element 62. The carrier gas heating chamber or jacket 72 surrounds the heating element 62 and channels through into an intermediate point within the heated contact surface 48. In this manner, the carrier gas from feed tube 42 (see FIG. 1) is introduced through entry port 64, circulates through the jacket 72, in which the carrier gas will be heated by its proximity to heating element 62, and then passes into the heated contact surface 48 where it can admix with the vaporized precursor material being generated therein. The flow of carrier gas thus proceeds to a flow ring 76 (see FIGS. 3a and 3b) which is positioned between individual ones of the porous contact disks. A vacuum insulator jacket 82 encompasses the entire vaporizing portion of the vaporizer 40 in order to insulate the apparatus from ambient conditions.

Figure 3A:
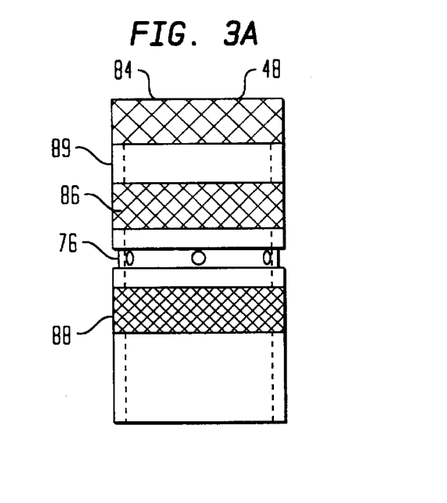
FIGS. 3a and 3b are schematic representations of a number of porous contact surfaces for use in a vaporization system in accordance with the present invention.
Figure 3B:
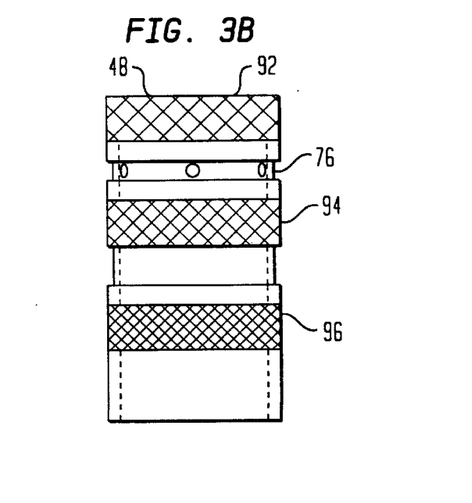

FIGS. 3a and 3b illustrate two different embodiments of the heated contact surface 48. FIG. 3a illustrates the use of a heated contact surface employing three porous contact disks 84, 86, and 88, aligned in series where the flow ring 76 is positioned between porous disks 86 and 88. In FIG. 3b, the three porous contact disks utilized are designated by reference numerals 92, 94 and 96, and flow ring 76 is positioned between porous disks 92 and 94. Note that in either orientation, as in FIG. 3a or 3b, the set of porous disks is always disposed within the portion of the vaporizer 40 which includes vaporization as depicted in FIG. 2, where the disks are facing the orifice of the ultrasonic nozzle 24.

In operation, liquid precursor is fed through feed tube 22 and is atomized by the operation of the ultrasonic nozzle 24. Once atomized in a fine liquid mist, the precursor is surrounded by curtain gas emitted through the curtain gas inlet 28. The curtain 25 of gas keeps the atomized mist from contacting the walls of the vaporizer 40 and escorts the atomized precursor mist to the heated contact surface 48 through the expansion chamber 34. The walls of the vaporizer 40 are cooled by virtue of the cooling jacket 26 to prevent premature vaporization of the atomized liquid precursor mist generated by the ultrasonic nozzle 24. This feature of the invention thus allows vaporization to take place in a specified segment of the vaporizer and provides for independent flow rate and stoichiometry adjustment due to the controlled vaporization.

Once the atomized liquid precursor mist arrives at the face of the first heated contact disk 52, it vaporizes upon contact therewith, and passes through the contact disk 52. The temperature of the heated contact surface 48 may be controlled using the heating element 62 voltage control. When the precursor vapor is between the contact disks 52, 54 and 56, it is mixed with carrier gas introduced through the flow ring 76. It is thus noted that the carrier gas travels through a preheater chamber 72 so the vaporized precursor does not experience a temperature change when it makes contact with the carrier gas. Thus, there is no threat of condensation present within the heated contact surface 48. The vapor mixture continues through the contact disks and out into the reactor 50 past interface 64. By choosing contact disks with differing porosities, the proper pressure drop can be established between the ultrasonic nozzle and the vaporizer exit.

The porosity of each contact disk is determined from a relationship between the surface area within the disk and the in-line pressure drop through the disk. The sum of the drop in pressure equals the drop required between the ultrasonic nozzle and the rest of the path distance which the precursor must travel. When the sums are equal, the nozzle is effectively isolated from the pressure at the exit of the vaporizer. The total surface area of the disk is generally chosen as a multiple of the area covered by a 1 $\mu$ thick layer of liquid after 1 minute of flow (area=Mult×(ml/min)/1 $\mu$). Through the selection of disk porosity and thickness the proper set of contact disks for any application may be determined.

In addition to choosing the proper contact surface, the pressure drop may be controlled and adjusted with even more precision by placing the flow ring 76 between either contact disks 52 and 54, or between 54 and 56. By choosing the proper media and flow ring configuration, the pressure drop can be modified so as to establish the appropriate exit pressure.

Once the precursor vapor mixture exits the vaporizer apparatus 40, the vapor will travel to the reaction chamber 50 where the precursor will deposit onto the desired target substrate.

Because this invention provides for independent controllability of temperature, pressure, and precursor stoichiometry it may be employed for many CVD applications requiring the use of solid or low volatility precursors. As such, this invention is not limited to microelectronic applications. Superconductors, nitride and oxide depositions are all possible by virtue of this invention.

While the above preferred embodiments of the present invention are completely described, various modifications, alternatives and equivalents may be used. Therefore, the above descriptions should not be taken as limiting the scope of the invention which is defined by the metes and bounds of the appended claims.

What is claimed is:

1. A liquid vaporizer apparatus for use in connection with chemical vapor deposition processes comprising:
    (a) a chamber having at least one liquid precursor supply inlet and at least one vapor outlet;
    (b) an ultrasonic nozzle for converting said at least one liquid precursor into an atomized mist having a consistent droplet sizes distribution which is independent of gas pressures within said chamber; and
    (c) a heated contact surface disposed between said ultrasonic nozzle and said at least one vapor outlet for preventing said atomized mist from exiting said at least one vapor outlet without contacting said heated contact surface for vaporizing substantially all of said atomized mist by direct contact with said heated contact surface within said chamber, whereby a vapor can be supplied from said at least one vapor outlet.

2. The apparatus of claim 1 wherein said chamber includes inner walls, and including gas curtain means for introducing a curtain of unheated gas into said chamber for preventing said atomized mist from contacting said inner walls of said chamber and for preventing valorization of said atomized mist prior to contact with said heated contact surface.

3. The apparatus of claim 1 wherein said heated contact surface comprises at least one porous contact member.

4. The apparatus of claim 3 wherein said at least one porous contact member comprises at least one porous disk.

5. The apparatus of claim 3 including a plurality of said porous contact members.

6. The apparatus of claim 5 wherein said plurality of porous contact members are arranged in series, substantially perpendicularly aligned with respect to said ultrasound nozzle.

7. The apparatus of claim 1, including carrier gas means for introducing a heated carrier gas at a temperature substantially corresponding to that of said vapor proximate to said heated contact surface so as to mix said vapor with said heated carrier gas.

8. The apparatus of claim 1, wherein said chamber includes cooling means for cooling said ultrasound nozzle.

9. The apparatus of claim 8, wherein said chamber includes at least one thermocouple for monitoring the inside temperature of said chamber and for controlling said cooling means.

10. The apparatus of claim 7, including heating means for heating said heated contact surface.

11. The apparatus of claim 10, wherein said chamber includes a jacket surrounding said heating means and associated with said carrier gas means for preheating said carrier gas prior to introduction proximate to said heated contact surface.

12. The apparatus of claim 1, further comprising an outer evacuated jacket for insulating said chamber from ambient temperatures.

13. The apparatus of claim 1, wherein said heated contact surface is removable.

14. The apparatus of claim 5, wherein said plurality of porous contact members vary in porosity whereby a pressure gradient is formed between said chamber and said at least one vapor outlet.

15. The apparatus of claim 1, wherein said apparatus includes means for connecting said at least one vapor outlet to a CVD reaction chamber.

16. A liquid vaporizer apparatus for supplying a vapor to a chemical vapor deposition reaction chamber comprising:
   (a) a chamber having at least one liquid supply inlet for supplying at least one liquid precursor to said chamber and at least one vapor outlet;
   (b) an ultrasonic nozzle for ultrasonically atomizing said at least one liquid precursor into an atomized mist having a consistent droplet size distribution independent of gas pressures within said chamber;
   (c) a heated contact surface disposed between said ultrasonic nozzle and said at least one vapor outlet for preventing said atomized mist from exiting said at least one vapor outlet without contacting said heated contact surface for vaporizing substantially all of said atomized mist by direct contact with said heated contact surface within said chamber, whereby a vapor can be supplied from said at least one vapor outlet; and
   (d) control means for preventing premature vaporization of said atomized mist prior to contact with said heated contact surface.

17. The apparatus of claim 16, wherein said chamber includes inner walls, and wherein said control means comprises gas curtain means for introducing a curtain of unheated gas into said chamber for preventing said atomized mist from contacting said inner walls of said chamber.

18. The apparatus of claim 16, wherein said heated contact surface comprises at least one porous contact member.

19. The apparatus of claim 18 wherein said at least one porous contact member comprises at least one porous disk.

20. The apparatus of claim 18 including a plurality of said porous contact members.

21. The apparatus of claim 14 wherein said plurality of porous contact members are arranged in series, substantially perpendicularly aligned with respect to said atomizing means.

22. The apparatus of claim 16, including carrier gas means for introducing a carrier gas proximate to said heated contact surface so as to mix said vapor with said carrier gas.

23. The apparatus of claim 16, wherein said control means comprises cooling means for cooling said ultrasonic nozzle.

24. The apparatus of claim 23, wherein said control means includes cooling control means for controlling said cooling means.

25. The apparatus of claim 24, wherein said cooling control means comprises a thermocouple.

26. The apparatus of claim 22 including heating means for heating said heated contact surface.

27. The apparatus of claim 26, wherein said chamber includes a jacket surrounding said heating means and associated with said carrier gas means for preheating said carrier gas prior to introduction proximate to said heated contact surface.

28. The apparatus of claim 16, further comprising an outer evacuated jacket for insulating said chamber from ambient temperatures.

29. The apparatus of claim 16, wherein said heated contact surface is removable.

30. The apparatus of claim 20, wherein said plurality of contact members vary in porosity whereby a pressure gradient is formed between said chamber and said at least one vapor outlet.

31. A method of vaporizing a liquid precursor for use in a chemical vapor deposition process comprising the steps of:
   (a) providing a liquid precursor at a preselected temperature to an ultrasonic nozzle within a chamber;
   (b) ultrasonically atomizing said liquid precursor into an atomized mist substantially at said preselected temperature;
   (c) vaporizing said atomized mist into a vapor by contacting said atomized mist with a heated contact surface; and
   (d) maintaining said liquid precursor in the form of said atomized mist prior to contacting said atomized mist with said heated contact surface whereby substantially all of said atomized mist is vaporized by direct contact with said heated contact surface.

32. The method of claim 31 including providing a gas curtain within said chamber surrounding said liquid precursor mist so as to prevent said liquid precursor mist from contacting the walls of said chamber.

33. The method of claim 31 wherein said liquid precursor is intended for use in a chemical vapor deposition reactor, and including supplying said vapor to said chemical vapor deposition reactor.

34. The method of claim 31 including contacting said liquid precursor with a plurality of said heated contact surfaces in series.

35. The method of claim 31 including introducing a carrier gas at a location proximate to said heated contact surface so as to mix said vapor with said carrier gas.

36. The method of claim 31 including providing cooling during said atomizing step.

37. The method of claim 35 including preheating said carrier gas prior to introducing said carrier gas at a location proximate to said heated contact surface.

38. The method of claim 31, further comprising the step of removing said heated contact surface for cleaning.

39. The method of claim 31, wherein said liquid precursor comprises at least one liquid precursor for a BST film.

40. The method of claim 32, wherein said gas curtain comprises a gas selected from the group consisting of nitrogen and argon.

41. The method of claim 35, wherein said carrier gas comprises a gas selected from the group consisting of nitrogen and argon.

42. The method of claim 31, further comprising controlling the temperature during said vaporizing step.

43. A liquid vaporizer apparatus for supplying a vapor to a chemical vapor deposition reaction chamber comprising:
   (a) a chamber having at least one liquid precursor supply inlet and at least one vapor outlet;
   (b) an ultrasonic nozzle for ultrasonically converting said at least one liquid precursor into an atomized mist within said chamber;
   (c) a heated contact surface having a high thermal conductivity and high specific heat in order to obtain a uniform temperature distribution across said heated contact surface for vaporizing substantially all of said atomized mist by direct contact within said chamber, whereby a vapor can be supplied from said at least one vapor outlet;
   (d) heating means for heating said heated contact surface; and
   (e) temperature control means for maintaining the temperature of said heated contact surface at a predetermined temperature for vaporizing said atomized mist, whereby the temperature of said heated contact surface is independent of the temperature of said atomized mist.

44. The apparatus of claim 43 wherein said chamber includes inner walls, and including gas curtain means for introducing a curtain of gas into said chamber for preventing said atomized mist from contacting said inner walls of said chamber.

45. The apparatus of claim 43 wherein said heated contact surface has a predetermined porosity, pore size and high surface area sufficient to vaporize substantially all of said atomized mist by direct contact therewith.

46. The apparatus of claim 45 wherein said surface area of said heated contact surface is between about 500 $m^2/m^3$ and about 7500 $m^2/m^3$.

47. The apparatus of claim 43, wherein said chamber includes a jacket surrounding said heating means and associated with said carrier gas means for preheating said carrier gas prior to introduction proximate to said heated contact surface.

48. A liquid vaporizer apparatus for use in connection with chemical vapor deposition processes comprising:

(a) a chamber having at least one liquid precursor supply inlet and at least one vapor outlet;

(b) an ultrasonic nozzle for converting said at least one liquid precursor into an atomized mist within said chamber;

(c) a heated contact surface disposed perpendicularly between said ultrasonic nozzle and said at least one vapor outlet for preventing said atomized mist from exiting said at least one vapor outlet without contacting said heated contact surface for vaporizing substantially all of said atomized mist by direct contact with said heated contact surface within said chamber, whereby a vapor can be supplied from said at least one vapor outlet; and (d) carrier gas means for introducing a heated carrier gas proximate to said heated contact surface so as to avoid contacting said heated carrier gas with said atomized mist and mix said vapor with said heated carrier gas.

49. The apparatus of claim 48 wherein said chamber includes inner walls, and including gas curtain means for introducing a curtain of unheated gas into said chamber for preventing said atomized mist from contacting said inner walls of said chamber and for preventing vaporization of said atomized mist prior to contact with said heated contact surface.

50. The apparatus of claim 48 including cooling means within said chamber for cooling said ultrasonic nozzle.

51. A method of vaporizing a liquid precursor for use in a chemical vapor deposition process comprising the steps of:

(a) providing a liquid precursor to an ultrasonic nozzle within a chamber;

(b) ultrasonically atomizing said precursor into an atomized mist;

(c) vaporizing substantially all of said atomized mist into a vapor by contacting said atomized mist with a heated contact surface; and (d) delivering said atomized mist to said heated contact surface by means of an unheated gas whereby premature vaporizing of said atomized mist prior to contacting said heated contact surface is avoided.

52. The method of claim 51 wherein said unheated gas comprises a curtain gas surrounding said atomized mist so as to prevent said atomized mist from contacting the walls of said chamber.

53. A method of vaporizing a liquid precursor for use in a chemical vapor deposition process comprising the steps of:

(a) providing a liquid precursor including a solid material dissolved therein to an ultrafiltration nozzle within a chamber;

(b) ultrasonically atomizing said liquid precursor into an atomized mist; and (c) vaporizing substantially all of said atomized mist into a vapor by contacting said atomized mist with a heated contact surface whereby both said liquid and solid portions of said atomized mist are substantially simultaneously vaporized.

* * * * *

UNITED STATES PATENT AND TRADEMARK OFFICE
CERTIFICATE OF CORRECTION

PATENT NO. : 5,835,677
DATED : November 10, 1998
INVENTOR(S) : Li et al.

It is certified that error appears in the above-identified patent and that said Letters Patent is hereby corrected as shown below:

Column 10, line 19, "sizes" should read --size--.

Column 10, line 32, "valorization" should read --vaporization--.

Column 10, line 43, "ultrasound" should read --ultrasonic--.

Column 10, line 51, "ultrasound" should read --ultrasonic--.

Signed and Sealed this

Sixteenth Day of March, 1999

Attest:

Q. TODD DICKINSON

*Attesting Officer*    *Acting Commissioner of Patents and Trademarks*